(12) United States Patent
Fukuda

(10) Patent No.: US 6,865,126 B2
(45) Date of Patent: Mar. 8, 2005

(54) SEMICONDUCTOR MEMORY DEVICE CAPABLE OF RELIEVING DEFECTIVE CELL

(75) Inventor: Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/933,517

(22) Filed: Sep. 3, 2004

(65) Prior Publication Data

US 2005/0024959 A1 Feb. 3, 2005

Related U.S. Application Data

(62) Division of application No. 10/456,478, filed on Jun. 9, 2003.

(30) Foreign Application Priority Data

Apr. 2, 2003 (JP) ........................................ 2003-099512

(51) Int. Cl.[7] .............................. G11C 7/00; G11C 7/02; G11C 8/00; G06F 12/00
(52) U.S. Cl. .............. 365/200; 365/189.05; 365/189.08; 365/189.12; 365/194; 365/196; 365/205; 365/207; 365/214; 365/230.03; 365/230.06; 365/230.08; 365/233; 711/105
(58) Field of Search .......................... 365/200, 189.08, 365/189.12, 207, 233; 711/105

(56) References Cited

U.S. PATENT DOCUMENTS

| 6,201,744 | B1 | * | 3/2001 | Takahashi | ................... 365/200 |
|---|---|---|---|---|---|
| 6,269,033 | B1 | * | 7/2001 | Ishida et al. | ................. 365/200 |
| 6,272,056 | B1 | * | 8/2001 | Ooishi | ........................ 365/200 |
| 6,519,192 | B2 | * | 2/2003 | Ooishi | ........................ 365/200 |
| 2001/0017794 | A1 | * | 8/2001 | Fujioka et al. | .............. 365/196 |
| 2004/0114411 | A1 | * | 6/2004 | Noda et al. | .................... 365/49 |

OTHER PUBLICATIONS

Toshimasa Namekawa, et al., "Dynamically Shift–Switched Dataline Redundancy Suitable for DRAM Macro with Wide Data Bus," IEEE Journal of Solid–State Circuits, vol. 35, No. 5, May 2000, pp. 705–712.

T. Namekawa, et al., Symposium on VLSI Circuits Digest of Technical Papers, pp. 149–152, "Dynamically Shift–Switched Dataline Redundancy Suitable for DRAM Macro with Wide Data Bus", 1999.

* cited by examiner

*Primary Examiner*—David Nelms
*Assistant Examiner*—Ly Duy Pham
(74) *Attorney, Agent, or Firm*—Oblon, Spivak, McClelland, Maier & Neustadt, P.C.

(57) ABSTRACT

A semiconductor memory device includes a data line shift circuit, a plurality of data mask lines connected to the plurality of sense amplifier write circuits, respectively, and a plurality of mask circuits. The plurality of mask circuits each include at least one shift switch circuit and supply a mask signal to a sense amplifier write circuit, which is connected to a mask circuit different from that before a data line is shifted by the data line shift circuit, through the shift switch circuit and supply the mask signal to a sense amplifier write circuit, which is connected to the same mask circuit as that before the data line is shifted, not through the shift switch circuit.

8 Claims, 6 Drawing Sheets

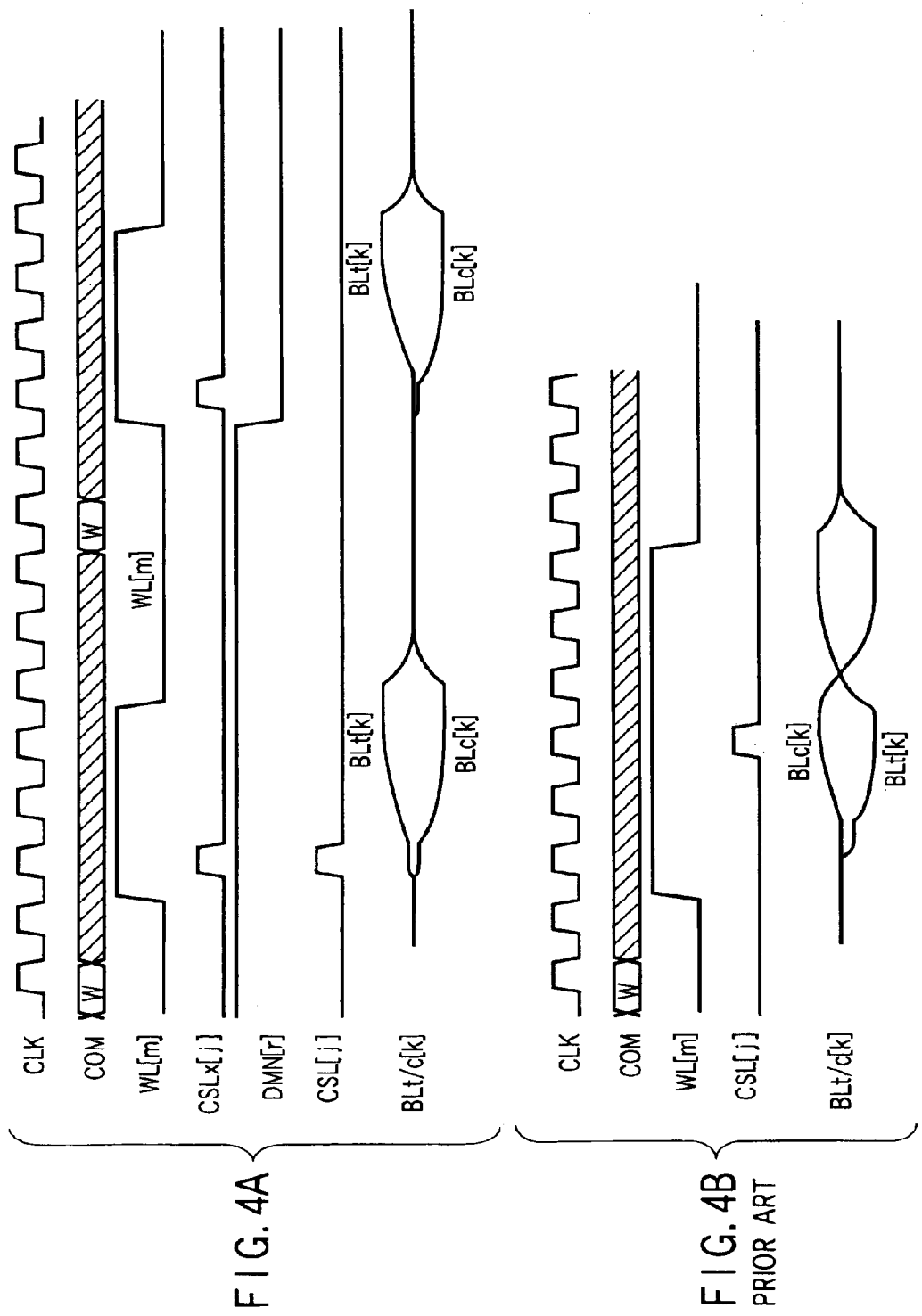
F I G. 4A
F I G. 4B PRIOR ART

SEMICONDUCTOR MEMORY DEVICE CAPABLE OF RELIEVING DEFECTIVE CELL

CROSS-REFERENCE TO RELATED APPLICATIONS

This application is a divisional of co-pending U.S. patent application Ser. No. 10/456,478, filed Jun. 9, 2003, the entire contents of which are hereby incorporated herein by reference.

This application is based upon and claims the benefit of priority from the prior Japanese Patent Application No. 2003-099512, filed Apr. 2, 2003, the entire contents of which are incorporated herein by reference.

BACKGROUND OF THE INVENTION

1. Field of the Invention

The present invention relates to a semiconductor memory device. More specifically, the invention relates to a semiconductor memory device having a data mask function and a data line shift redundancy function.

2. Description of the Related Art

It has recently been essential for highly integrated semiconductor memory devices to adopt a redundancy technology of replacing a defective cell with a redundant cell. In particular, an embedded DRAM (dynamic random access memory) has a data line shift redundancy function of relieving a defective cell by replacing an internal data line with its adjacent one (see, for example, T. Namekawa et al., "Dynamically Shift-Switched Data Line Redundancy Suitable for DRAM Macro with Wide Data Bus," 1999 Symposium on VLSI Circuits, Digest of Papers, pp. 149–152)

FIGS. 5A and 5B are diagrams illustrating the main part of a DRAM to describe the above data line shift redundancy function. For the sake of simple descriptions, it is assumed that sixteen input/output data lines are provided for each cell array. Of the input/output lines, only the input data lines DI[i] (i=0, 1, 2, . . . , 15) are shown and the output data lines are omitted because their connections are the same as those of the input data lines DI[i].

Referring to FIG. 5A, input data lines DI[i] to DI[15] of a cell array 100 are connected to their respective sense amplifier (SA) write circuits 102 through a shift switch circuit block (data line shift circuits) 101. When a write signal WE is activated, the SA write circuits 102 write cell data (high "H" or low "L") of the input data lines DI[0] to DI[15] to their corresponding internal data lines DQt[p] and DQc[p] (or represented together as DQt/c[p]: p=0, 1, 2, . . . , 15) which are complementary to each other. When there are no defective cells as shown in FIG. 5A, the input data lines DI[0] to DI[15] are connected to their respective internal data lines DQt/c[0] to DQt/c[15].

In contrast, when the internal data line DQt/c[2] is defective (cross X) (or a cell connected to the internal data line is defective) as shown in FIG. 5B, the input data line DI[2] that is to be connected to the internal data line DQt/c[2] is shifted by the shift switch circuit block 101 and connected to the internal data line DQt/c[1]. The adjacent input data line DI[1] is connected to the internal data line DQt/c[0] and its adjacent input data line DI[0] is connected to the internal data line DQt/c[15(−1)] of adjacent another cell array $100_{-1}$. Thus, the input data lines DI[0] to DI[2] are shifted one by one by the shift switch circuit block 101 and connected to their respective internal data lines DQt/c[p−1].

When the internal data line DQt/c[9] is defective (cross X) (or a cell connected to the internal data line is defective), the input data line DI[9] that is to be connected to the internal data line DQt/c[9] is shifted by the shift switch circuit block 101 and connected to the internal data line DQt/c[10]. The adjacent input data line DI[10] is connected to the internal data line DQt/c[11], . . . , and its adjacent input data line DI[15] is connected to the internal data line DQt/c[0(+1)] of adjacent another cell array $100_{+1}$. Thus, the input data lines DI[9] to DI[15] are shifted one by one by the shift switch circuit block 101 and connected to their respective internal data lines DQt/c[p+1].

In other words, each of the input data lines DI[i] is shifted by the shift switch circuit block 101 such that it is connected to the internal data line DQt/c[p+1] or DQt/c[p−1] adjacent to the internal data line DQt/c[p]. Therefore, the relief of defective cells (data line shift redundancy) can be achieved by replacing the internal data lines DQt/c[p].

FIG. 6 is a diagram illustrating the periphery of the DRAM cell to describe the foregoing data mask function. For the sake of simple descriptions, it is assumed that the number of DRAM cells is one.

As described above, the input/output data line (input data line DI[i] and output data line DO[i]) is connected to the SA write circuit 102a and SA read circuit 102b via the shift switch circuit block 101. The SA write circuit 102a and SA read circuit 102b are supplied with a write signal WE and a read signal RE, respectively. The internal data line DQt/c[p] is connected to the SA write and read circuits 102a and 102b. When the write signal WE is activated, the SA write circuit 102a writes cell data of input data line DI[i] to the internal data line DQt/c[p]. When the read signal RE is activated, the SA read circuit 102b writes cell data of the internal data line DQt/c[p] to the output data line DO/[i].

Bit lines BLt[k] and BLc[k] (or represented together as BLt/c[k]) of complementary signal lines are connected to the internal data line DQt/c[p] through column select transistors 201. A column select signal line CSL[j] is connected to the gate of each of the column select transistors 201. When the column select signal line CSL[j] is activated, the internal data lines DQt/c[p] and bit lines BLt/c[k] are electrically connected to each other. A sense amplifier (SA) 202 is connected to the bit lines BLt/c[k]. The sense amplifier 202 amplifies cell data read out of a memory cell (DRAM cell) 203 and cell data to be written to the memory cell 203.

The memory cell 203 includes a memory cell transistor 203a and a memory cell capacitor 203b. The source of the memory cell transistor 203a is connected to one of the bit lines BLt[k] and BLc[k]. In FIG. 6, the source of the memory cell transistor 203a is connected to the bit line BLt[k]. The drain of the memory cell transistor 203a is connected to one node (storage node) of the memory cell capacitor 203b. The gate of the memory cell transistor 203a is connected to a word line WL[m]. When the word line WL[m] is activated, the memory cell 203 connected to the word line WL[m] is selected (accessed). Thus, the selected memory cell 203 is connected to the SA 202 to read or write cell data. The other node of the memory cell capacitor 203b is connected to the potential VPL.

The data mask signal line DM[n] connected to the SA write circuit 102a and SA read circuit 102b fulfills the above-described data mask function. In other words, it restricts the write of cell data to the internal data line DQt/c[p]. For example, even though the write signal WE is activated in data write mode, the write of cell data to the internal data line DQt/c[p] is considered to be invalid in the SA write circuit 102a in which the data mask signal line DM[n] is activated. In most cases, a single data mask signal line DM[n] is assigned to a plurality of (e.g., eight) input data lines DI[i] in the data mask function.

When the data mask function is added to the DRAM with the data line shift redundancy function, the SA write circuit 102a and SA read circuit 102b have to correspond to different data mask signal lines DM[n] according to the specifications of the data line shift redundancy function. If, therefore, it is assumed that a single data mask signal line DM[n] is assigned to eight input data lines DI[i] as shown in FIG. 7, a shift switch circuit block 301 for data mask (DM) should be provided in correspondence with the data mask signal lines DM[n] and so should be the same number of internal data mask lines DMN[r] (r=0, 1, 2, . . . , 15) as that of input data lines DI [i].

In the DRAM, if the number of input/output data lines DI[i]/DO[i] is large, the same number of internal data mask lines DMN[r] prevent the wiring layers from decreasing in number and increase the power consumption.

BRIEF SUMMARY OF THE INVENTION

According to a first aspect of the present invention, there is provided a semiconductor memory device comprising: a plurality of memory cells each of which is connected between a bit line and a word line and which store cell data; a plurality of sense amplifiers which are connected to the plurality of memory cells, respectively and which read cell data from the memory cells and write cell data to the memory cells, respectively; a plurality of sense amplifier write circuits which are connected to the plurality of sense amplifiers, respectively and which write cell data to the sense amplifiers, respectively; a plurality of data lines which are connected to the plurality of sense amplifier write circuits, respectively and to which the cell data to be written to the sense amplifiers is written; a data line shift circuit which shifts an arbitrary one of the data lines and replaces the arbitrary one with a data line adjacent thereto; a plurality of data mask lines connected to the plurality of sense amplifier write circuits, respectively; and a plurality of mask circuits which are provided for a given number of data mask lines of the plurality of data mask lines and which supply a mask signal, which invalidates write of the cell data to a given number of data lines, to the sense amplifier write circuits connected to the given number of data mask lines, wherein the plurality of mask circuits each include at least one shift switch circuit and supply the mask signal to a sense amplifier write circuit, which is connected to a mask circuit different from that before a data line is shifted by the data line shift circuit, through the shift switch circuit and supply the mask signal to a sense amplifier write circuit, which is connected to a same mask circuit as that before the data line is shifted, not through the shift switch circuit.

According to a second aspect of the present invention, there is provided a semiconductor memory device comprising: a plurality of memory cells each of which is connected between a bit line and a word line and which store cell data; a plurality of sense amplifiers which are connected to the plurality of memory cells, respectively and which read cell data from the memory cells and write cell data to the memory cells, respectively; a plurality of sense amplifier write circuits which are connected to the plurality of sense amplifiers, respectively and which write cell data to the sense amplifiers, respectively; a plurality of data lines which are connected to the plurality of sense amplifier write circuits, respectively and to which the cell data to be written to the sense amplifiers is written; a data line shift circuit which shifts one of the data lines and replaces the shifted one with a data line adjacent thereto; a plurality of select transistors to activate the plurality of data lines; a plurality of gate circuits which control the plurality of select transistors, respectively; a plurality of data mask lines each connected to one input terminal of a corresponding one of the plurality of gate circuits; and a plurality of mask circuits which are provided for a given number of data mask lines of the plurality of data mask lines and which supply a mask signal, which invalidates write of the cell data to a sense amplifier, to the gate circuits connected to the given number of data mask lines, wherein a word line of a memory cell to be accessed is activated after cell data is written to a given sense amplifier in write mode.

BRIEF DESCRIPTION OF THE SEVERAL VIEWS OF THE DRAWING

FIGS. 4A and 4B are timing charts for describing an operation of the DRAM shown in FIG. 3 in data write mode;

DETAILED DESCRIPTION OF THE INVENTION

Embodiments of the present invention will now be described with reference to the drawings.

(First Embodiment)

Figure 1:
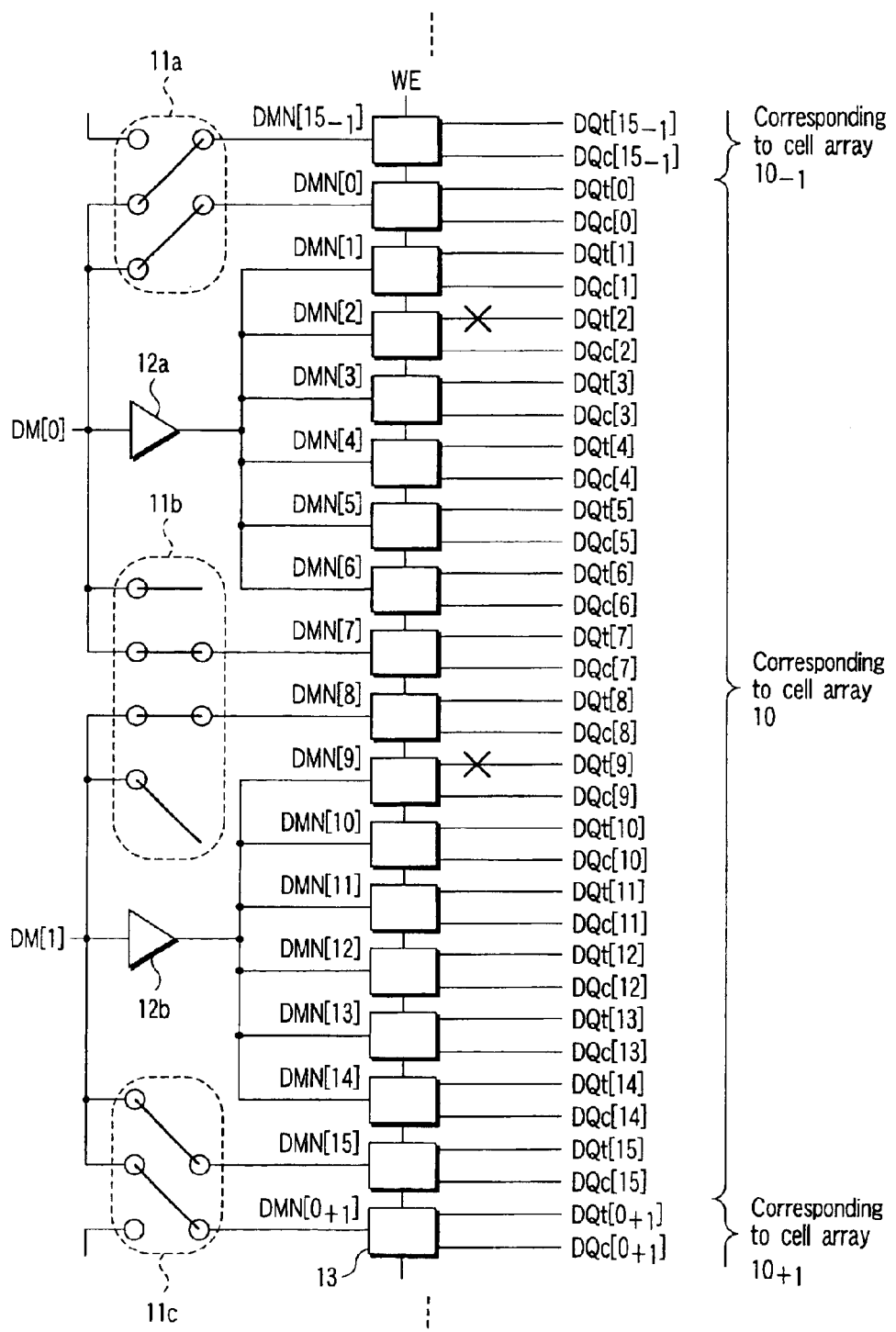
FIG. 1 is a diagram of the main part of a DRAM according to a first embodiment of the present invention.
Figure 5A:
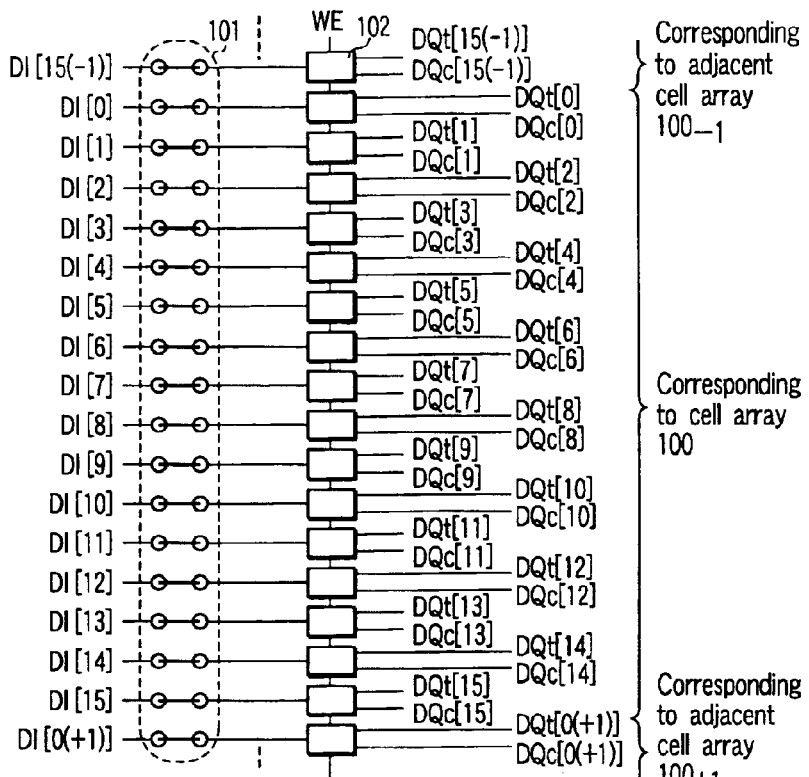
FIGS. 5A and 5B are diagrams for describing a data line shift redundancy function of prior art.
Figure 5B:
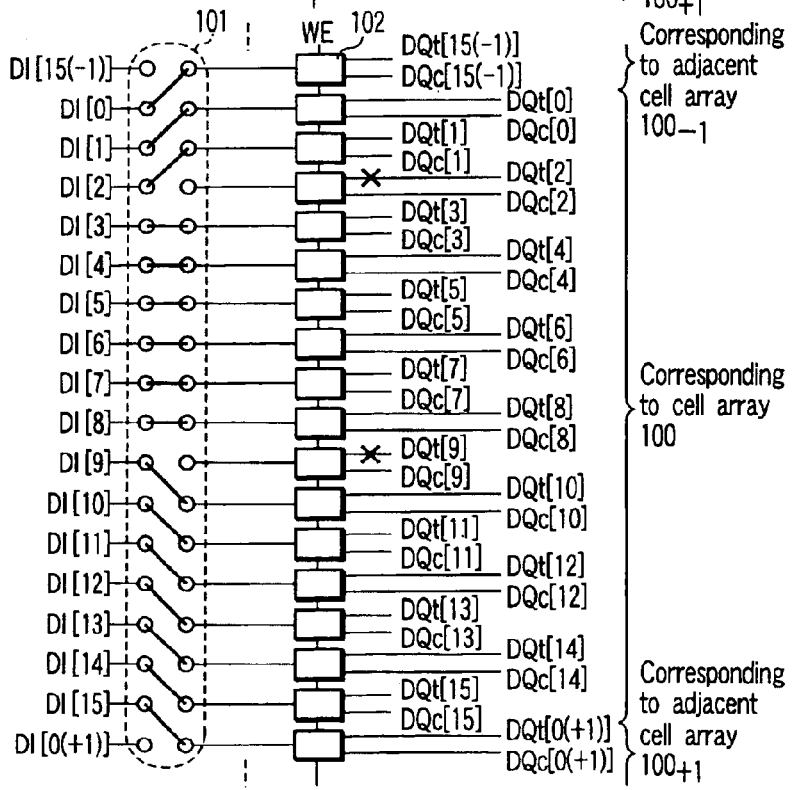

FIG. 1 shows the main part of a semiconductor memory device according to a first embodiment of the present invention. More specifically, FIG. 1 shows an example of formation of wires (data mask signal lines and internal data mask lines) due to the addition of a data mask function in a DRAM having a data line shift redundancy function. For the sake of simple descriptions, the number of input/output data lines is sixteen for each cell array (see FIGS. 5A and 5B with respect to the formation of input data lines DI[i]).

In the first embodiment, two data mask signal lines DM[n] (n=0, 1) are provided for each of cell arrays $10_{-1}$, 10 and $10_{+1}$. Eight internal data mask lines DMN[r(a)](r(a)=r−r(b)=0, 1, 2, . . . , 7) are provided for one data mask signal lines DM[0]. Of the internal data mask lines DMN[0] to DMN[7], the internal data mask line DMN[0] is connected to the data mask signal line DM[0] via a DM shift switch circuit block 11a, the internal data mask lines DMN[1] to DMN[6] are connected thereto via a buffer 12a, and the internal data mask line DMN[7] is connected thereto via a DM shift switch circuit block 11b.

Similarly, eight internal data mask lines DMN[r(b)](r(b)=r−r(a)=8, 9, 10, . . . , 15) are provided for the other data mask signal lines DM[1]. Of the internal data mask lines DMN[8] to DMN[15], the internal data mask line DMN[8] is connected to the data mask signal line DMN[1] via a DM shift switch circuit block 11b, the internal data mask lines DMN[9] to DMN[14] are connected thereto via a buffer 12b, and the internal data mask line DMN[15] is connected thereto via a DM shift switch circuit block 11c.

An internal data mask line DMN [$15_{-1}$] for an adjacent cell array $10_{-1}$ is connected to the DM shift switch circuit block 11a. An internal data mask line DMN [$0_{+1}$] for an adjacent cell array $10_{+1}$ is connected to the DM shift switch circuit block 11c.

The internal data mask lines DMN[0] to DMN[15] are connected to their respective SA write/read circuits 13. Internal data lines DQt[p] and DQc[p] (or represented together as DQt/c[p] (p=0, 1, 2, . . . , 15)) of complementary signal lines are connected to each of the SA write/read circuits 13. A write signal WE is supplied to each of the SA write/read circuits 13. The write signal WE is activated when the circuit 13 writes data upon receipt of a write command. A read signal RE is also supplied to each of the SA write/read circuits 13, but it is omitted because it has nothing to do with the data mask function.

The switching of the DM shift switch circuit blocks 11a, 11b and 11c is controlled in accordance with the states of the foregoing data line shift redundancy. More specifically, for the internal data mask lines DMN [7] and [8] connected to the DM shift switch circuit block 11b, the data mask signal line DM[0] or DM[1] of the cell array 10 is valid in accordance with the states of the data line shift redundancy. For the internal data mask line DMN [$15_{-1}$]] connected to the DM shift switch circuit block 11a, the data mask signal line DM[0] of the cell array 10 or the data mask signal line DM[1] of the cell array $10_{-1}$ is valid in accordance with the states of the data line shift redundancy. For the internal data mask line DMN [$0_{+1}$]] connected to the DM shift switch circuit block 11c, the data mask signal line DM[1] of the cell array 10 or the data mask signal line DM[0] of the cell array $10_{+1}$ is valid in accordance with the states of the data line shift redundancy.

When the internal data lines DQt[2] and DQt[9] (or cells connected thereto) are defective as indicated by crosses X in FIG. 1, the data mask signal line DM[0] of the cell array 10 is valid for the internal data mask line DMN[$15_{-1}$] of the cell array $10_{-1}$ and the internal data mask line DMN[7] of the cell array 10. Further, the data mask signal line DM[1] of the cell array 10 is valid for the internal data mask line DMN[8] of the cell array 10 and the internal data mask line DMN [$0_{+1}$] of the cell array $10_{+1}$.

For the internal data mask lines DMN[1] to DMN[6] and DMN[9] to DMN[14] connected to the buffers 12a and 12b, valid data mask signal lines DM[0] and DM[1] are predetermined irrespective of the states of data line shift redundancy. More specifically, the data mask signal line DM[0] is always valid for the internal data mask lines DMN[1] to DMN[6] and the data mask signal line DM[1] is always valid for the internal data mask lines DMN[9] to DMN[14]. The above buffers 12a and 12b are provided in order to reduce a fan-out when one data mask signal is distributed to the SA write/read circuits 13.

In the foregoing arrangement, when the write signal WE is activated, the SA write/read circuits 13 write cell data (H or L) of input data lines DI[i] to the internal data lines DQt/c[p]. At this time, the SA write/read circuits 13 whose corresponding internal data mask lines DMN[r(a), r(b)] are activated, do not write cell data to the internal data lines DQt/c[p]. Assume that the data mask signal line DM[0] is activated and the data mask signal line DM[1] is inactivated. If, in this state, the write signal WE is supplied to the SA write/read circuits 13, the write of cell data to the internal data lines DQt/c[$15_{-1}$] and DQt/c[0] to DQt/c[7] is invalidated and the write of cell data to the internal data lines DQt/c[8] to DQt/c[15] and DQt/c[$0_{+1}$] is validated. Thus, the data mask function of invalidating the write of cell data to the internal data lines DQt/c[p] is fulfilled.

In the foregoing arrangement, the internal data mask lines DMN[1] to DMN[6] and DMN[9] to DMN[14] have only to expand (branch) near the SA write/read circuits 13 and virtually the number of signal lines connected to the internal data mask lines DMN[r] can be decreased, as can be the number of shift switch circuits. Accordingly, the number of layout layers can be decreased and the power consumption can be prevented from increasing. In particular, when the distance to each of the SA write/read circuits 13 is long, e.g., when each of the SA write/read circuits 13 is provided near a cell array and a sense amplifier and the internal data mask line DMN[r] has to pass over another cell array, the arrangement of the first embodiment is advantageous.

In the first embodiment, one data mask signal line DM[n] is provided for eight input data lines DI[i]. The present embodiment is not limited to this. For example, the larger the number of input data lines DI[i] corresponding to one data mask signal line DM[n], the larger the number of internal data mask lines DM[i] that need not be shifted by data line shift redundancy. The advantage of the embodiment becomes great.

For the sake of simple descriptions, in the first embodiment, one SA write/read circuit is provided for one input data line DI[i]. The present embodiment is not limited to this. For example, SA write/read circuits can be provided for their respective cell arrays and selectively connected to a common input data line DI[i].

(Second Embodiment)

Figure 2A:
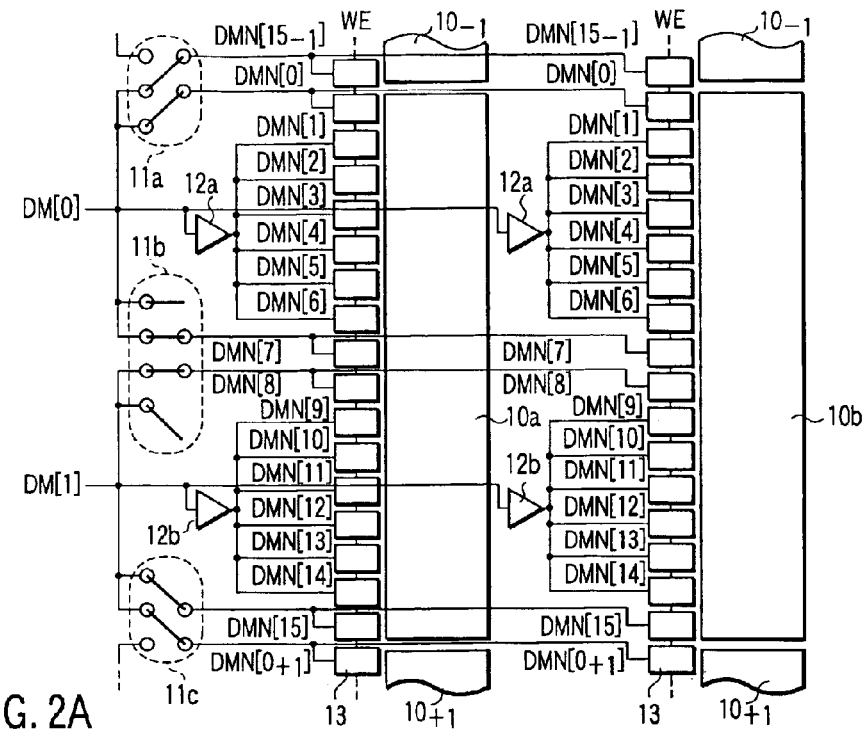
FIGS. 2A and 2B are diagrams showing the main part of a DRAM according to a second embodiment of the present invention and that of a prior art DRAM in order to compare them with each other.
Figure 2B:
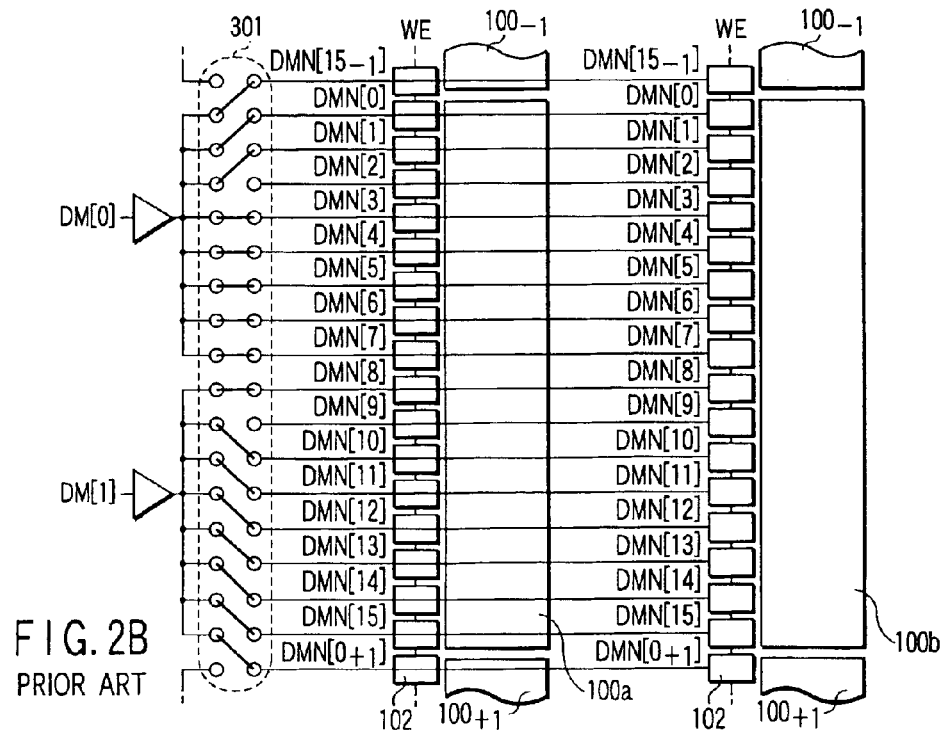
Figure 7:
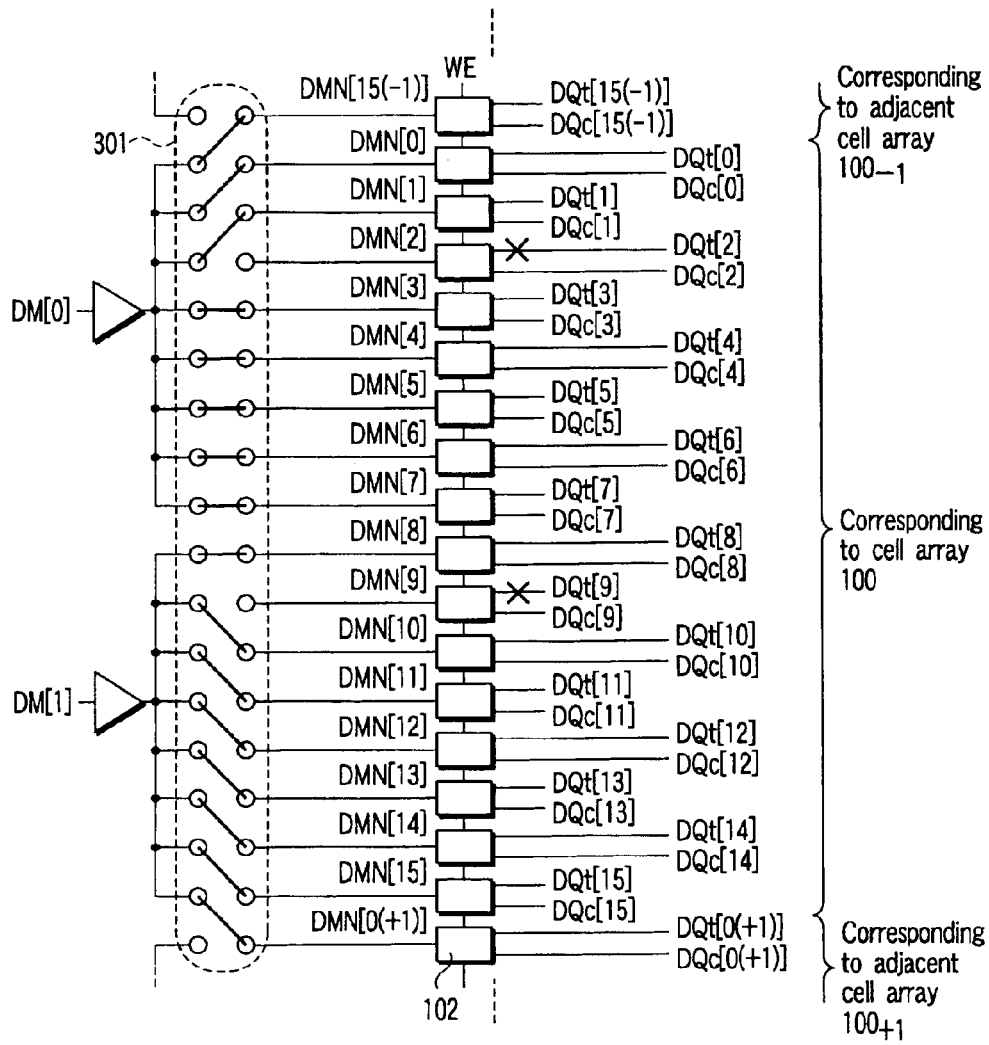
FIG. 7 is a diagram for explaining a prior art data mask function.

FIG. 2A shows the main part of a semiconductor memory device according to a second embodiment of the present invention and FIG. 2B shows that of a prior art semiconductor memory device in order to compare them with each other. More specifically, FIGS. 2A and 2B each show an example of formation of wires (data mask signal lines and internal data mask lines) due to the addition of a data mask function in a DRAM that is so configured that an SA write/read circuit provided for each cell array is selectively connected to a common input data line (data input line) by a selection signal. The same components as those of FIG. 1 or 7 are denoted by the same reference numerals and symbols and their detailed descriptions are omitted.

Referring to FIG. 2B, conventionally, it was necessary to cause all internal data mask lines DMN[r] to pass over a cell array 10a when the internal data mask lines DMN[r] were connected to both a plurality of SA write/read circuits 102 provided for a cell array 100a and a plurality of SA write/read circuits 102 provided for a cell array 100b.

In contrast, when the internal data mask lines DMN[1] to DMN[6] and DMN[9] to DMN[14] can be expanded near the SA write/read circuits 13 as shown in FIG. 1, the number of internal data mask lines DMN[r] that pass over the cell array 10a can greatly be reduced as shown in FIG. 2A. Accordingly, the wiring pitch can be increased and the number of wiring layers can be decreased. Since the number of internal data mask lines DMN[r] is small, power consumption can be reduced.

(Third Embodiment)

Figure 3:
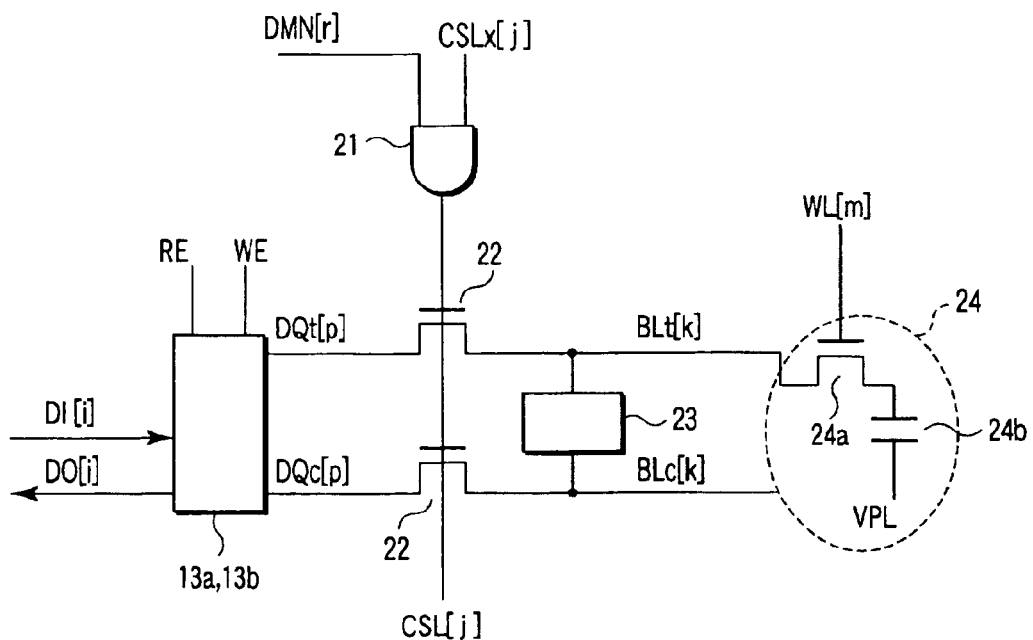
FIG. 3 is a diagram of the periphery of a cell of a DRAM according to a third embodiment of the present invention.

FIG. 3 shows the main part of a semiconductor memory device according to a third embodiment of the present invention. More specifically, FIG. 3 shows the periphery of a cell of a DRAM that is so configured that a word line to be accessed is activated after cell data is written to a sense amplifier in data write mode. For the sake of simple descriptions, the number of DRAM cells is one. The formation of input data lines DI[i] for one cell array is shown in, for example, FIGS. 5A and 5B, and that of data mask signal lines DM[n] and internal data mask lines DMN[r] are shown in, for example, FIG. 1.

Referring to FIG. 3, input/output data lines (an input data line DI[i] and an output data line DO[i]) are connected to internal data lines DQt/c[p] of complementary signal lines through an SA write circuit 13a and an SA read circuit 13b. When a write signal WE is activated, the SA write circuit 13a writes cell data (H or low) of the input data line DI[i] to the internal data lines DQt/c[p]. When a read signal RE is activated, the SA read circuit 13b writes cell data (H or L) of internal data lines DQt/c[p] to the output data line DO[i]. In this case, the SA write circuit 13a does not have a data mask function by itself (the data mask signal line DM(n) is not connected to the SA write circuit 13a).

An AND gate (gate circuit) 21 is provided to have the same data mask function as that of the foregoing SA write/read circuit 13. A column select line CSLx[j] is connected to one input terminal of the AND gate 21 and the internal data mask line DMN[r] is connected to the other input terminal thereof. The output terminal of the AND gate 21 is connected to a column select signal line CSL[j] that is connected to each of gates of column select transistors 22.

Bit lines BLt/c[k] of complementary signal lines are connected to the internal data lines DQt/c[p] through the column select transistors 22. A sense amplifier (SA) 23 is connected to the bit lines BLt/c[k]. The sense amplifier 23 amplifies both cell data that is read out of a memory cell (DRAM cell) 24 and cell data that is to be written to the memory cell 24.

The memory cell 24 includes a memory cell transistor 24a and a memory capacitor 24b. The source of the memory cell transistor 24a is connected to one of the bit lines BLt/c[k]. In FIG. 3, the source of the memory cell transistor 24a is connected to the bit line BLt[k]. The drain of the memory cell transistor 24a is connected to one node (storage node) of the memory cell capacitor 24b. The gate of the memory cell transistor 24a is connected to a word line WL[m]. When the word line WL[m] is activated, the memory cell 24 connected to the word line WL[m] is selected (accessed). Thus, the accessed memory cell 24 is connected to the sense amplifier 23 to read and write cell data. The other node of the memory cell capacitor 24b is connected to the potential VPL.

When the internal data mask line DMN[r] is activated, the write of cell data to the bit lines BLt/c[k] becomes invalid. More specifically, if the internal data mask line DMN[r] is activated while the column select signal CSLx[j] is being activated, the column select signal line CLS[j] becomes inactive. Thus, even though the write signal WE is activated in data write mode, cell data is inhibited from being written to the bit lines BLt/c[k] with respect to the sense amplifier 23 in which the data mask signal line DM[n] is activated.

With the above arrangement, the internal data mask line DMN[r] is routed closer to the cell array. If, therefore, the internal data mask line DMN[r] is so formed that it can expand near the SA write/read circuit 13 as shown in FIG. 1, the number of signal lines connected to the internal data mask line DMN[r] can effectively be reduced and so can be the number of shift switch circuits.

FIG. 4A shows a timing chart of an operation of the DRAM shown in FIG. 3 in data write mode and FIG. 4B shows that of an operation of the prior art DRAM to compare them with each other. As is apparent from FIG. 4A, when the word line WL[m] of cell 24 to be accessed is activated after cell data is written to the sense amplifier 23 in data write mode, the write operation can be performed like the read operation. Consequently, the following advantages are obtained. Adequate time to reverse the cell data of the sense amplifier 23 need not be considered, nor need be the influence of noise in write mode.

More specifically, in FIG. 4B, CLK indicates a clock signal for the operation and COM denotes a command signal supplied from outside the device. In response to the command signal, a read (R) or write (W) instruction is input at certain timing. Les us consider the case where the write instruction is input only once. The row address to be activated is omitted.

Figure 6:
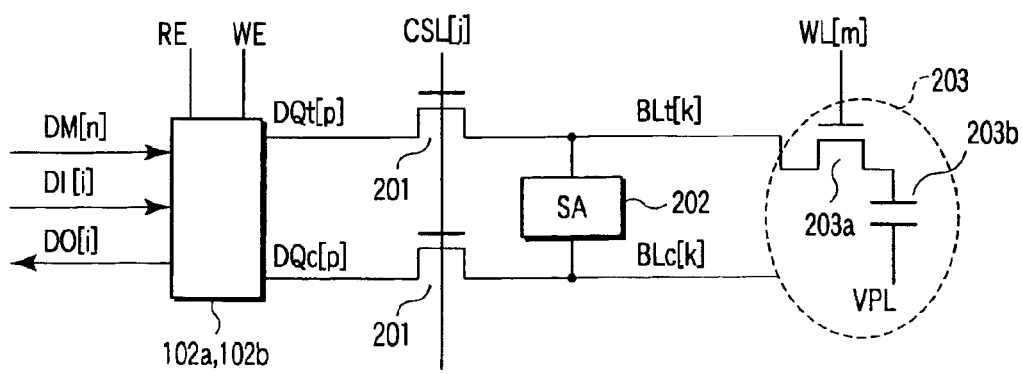
FIG. 6 is a diagram of the periphery of a cell of a prior art DRAM.

In the prior art device (see, for example, FIG. 6), a command signal COM is input and its corresponding word line WL[m] is activated in data write mode as shown in FIG. 4B. In accordance with the activation of the column select signal line CSL[j], cell data is written to the sense amplifier 202 from outside the device. Then, the sense amplifier 202 is activated to amplify the cell data. The amplified cell data is supplied to the memory cell 203 and stored therein (BLt/c[k] shows the waveform formed when reversed cell data is written). After that, the word line WL[m] is inactivated and thus the potential of the bit lines BLt/c[k] is equalized and returned to the initial level.

On the other hand, as shown in FIG. 4A, the DRAM shown in FIG. 3 performs a write operation as follows. In this case, a write instruction is input two times. The first write operation is performed when the internal data mask line DMN[r] is at a high level (inactive) and the second write operation is done when it is at a low level (active).

More specifically, in data write mode, the column select line CSLx[j] is activated in response to a command signal COM. If the internal data mask line DMN[r] is inactivated (in the first write operation), the column select signal line CSL[j] is activated. Thus, the cell data supplied from outside the device is written to the bit lines BLt/c[k] through the column select transistors 22. Before the sense amplifier 23 is activated, the corresponding word line WL[m] is activated. After that, the sense amplifier 23 is activated and the amplified cell data is stored in the memory cell 24. Then, the word line WL[m] is inactivated and the potential of the bit lines BLt/c[k] is equalized and returned to the initial level.

In the second write operation, the internal data mask line DMN[r] has already been activated. The same operation as the first write operation is performed until the word line WL[m] is activated. Since, however, the internal data mask line DMN[r] has been activated, the column select line CSLx[j] is activated but the column select line CSL[j] is not activated; consequently, the cell data of the internal data lines DQt/c[p] is not transmitted to the bit lines BLt/c[k].

As in the normal read operation, cell data is written to the bit lines BLt/c[k] (however, cell data is not written to the internal data lines DQt/c[p] but simply refreshed). The operation performed after the word line WL[m] is inactivated is the same as the first write operation.

As described above, in the DRAM so configured that the word line WL[m] of the memory cell 24 to be accessed is activated after cell data is written to the sense amplifier 23, when both the data mask function and data line shift redundancy function are fulfilled, the column select signal line CSL[j] for selecting the sense amplifier 23 needs to be controlled by the internal data mask line DMN[r]. Therefore, the internal data mask line DMN[r] is formed in the cell array more deeply. Consequently, as described above, the number of signal lines connected to the internal data mask line DMN[r] can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a plurality of memory cells each of which is connected between a bit line and a word line and which store cell data;
    a plurality of sense amplifiers which are connected to the plurality of memory cells, respectively and which read cell data from the memory cells and write cell data to the memory cells, respectively;
    a plurality of sense amplifier write circuits which are connected to the plurality of sense amplifiers, respectively and which write cell data to the sense amplifiers, respectively;
    a plurality of data lines which are connected to the plurality of sense amplifier write circuits, respectively and to which the cell data to be written to the sense amplifiers is written;
    a data line shift circuit which shifts one of the data lines and replaces the shifted one with a data line adjacent thereto;
    a plurality of internal data lines which connect the plurality of sense amplifiers and the plurality of sense amplifier write circuits;
    a plurality of select transistors to activate the plurality of internal data lines;
    a plurality of gate circuits which control the plurality of select transistors, respectively;
    a plurality of data mask lines each connected to one input terminal of a corresponding one of the plurality of gate circuits; and
    a plurality of mask circuits which are provided for a given number of data mask lines of the plurality of data mask lines and which supply a mask signal, which invalidates write of the cell data to a sense amplifier, to the gate circuits connected to the given number of data mask lines,
    wherein a word line of a memory cell to be accessed is activated after cell data is written to a given sense amplifier in write mode.

2. The semiconductor memory device according to claim 1, wherein the plurality of mask circuits each include at least one mask signal line, and the mask signal line is connected to a data mask line of a sense amplifier write circuit, which is connected to a same mask circuit as that before a data line is shifted, immediately before each of the sense amplifier write circuits.

3. The semiconductor memory device according to claim 2, wherein the plurality of mask circuits each include at least one buffer circuit, and the mask signal line is connected to a data mask line through the buffer circuit.

4. The semiconductor memory device according to claim 1, wherein the plurality of internal data lines each include signal lines of complementary signal lines.

5. The semiconductor memory device according to claim 1,
    wherein the plurality of bit lines each include signal lines of complementary signal lines.

6. The semiconductor memory device according to claim 1, wherein a signal line for column selection is connected to another input terminal of each of the plurality of gate circuits.

7. The semiconductor memory device according to claim 1, wherein the data line shift circuit has a data line shift redundancy function of relieving a defective memory cell by shifting a defective data line and replacing the shifted defective data line with a data line adjacent thereto.

8. The semiconductor memory device according to claim 1, wherein the plurality of mask circuits each include at least one shift switch circuit and supply the mask signal to a gate circuit, which is connected to a mask circuit different from that before a data line is shifted by the data line shift circuit, through the shift switch circuit and supply the mask signal to a gate circuit, which is connected to a same mask circuit as that before the data line is shifted, not through the shift switch circuit.

* * * * *